United States Patent
Koch et al.

(10) Patent No.: US 12,294,380 B2
(45) Date of Patent: May 6, 2025

(54) POWER SAVING ENCODING FOR ISOLATED GALVANICALLY DATA TRANSMISSION

(71) Applicant: Analog Devices International Unlimited Company, Limerick (IE)

(72) Inventors: Andreas Koch, Wiesbaden (DE); George Pieter Reitsma, Redwood City, CA (US)

(73) Assignee: Analog Devices International Unlimited Company, Limerick (IE)

( * ) Notice: Subject to any disclaimer, the term of this patent is extended or adjusted under 35 U.S.C. 154(b) by 217 days.

(21) Appl. No.: 18/295,714

(22) Filed: Apr. 4, 2023

(65) Prior Publication Data
US 2023/0370076 A1    Nov. 16, 2023

Related U.S. Application Data

(60) Provisional application No. 63/342,237, filed on May 16, 2022.

(51) Int. Cl.
    *H03M 1/12*      (2006.01)
    *H03M 1/00*      (2006.01)
    *H03M 1/38*      (2006.01)

(52) U.S. Cl.
    CPC ............ *H03M 1/002* (2013.01); *H03M 1/38* (2013.01)

(58) Field of Classification Search
    CPC .............................. H03M 1/002; H03M 1/38
    USPC ................................................ 341/155, 161
    See application file for complete search history.

(56) References Cited

U.S. PATENT DOCUMENTS

| | | | |
|---|---|---|---|
| 7,027,773 B1 | 4/2006 | Mcmillin | |
| 7,463,675 B2* | 12/2008 | Scott | ...................... H04M 11/06 |
| | | | 375/220 |
| 8,503,551 B2* | 8/2013 | Ko | ...................... H04L 25/0204 |
| | | | 455/130 |
| 9,054,727 B2 | 6/2015 | Steensgaard-Madsen | |
| 10,397,021 B2 | 8/2019 | Kessler et al. | |
| 11,018,776 B2 | 5/2021 | Hassan | |
| 2017/0019211 A1 | 1/2017 | Noh et al. | |
| 2020/0038651 A1 | 2/2020 | Borton et al. | |

* cited by examiner

*Primary Examiner* — Peguy Jean Pierre
(74) *Attorney, Agent, or Firm* — Schwegman Lundberg & Woessner, P.A.

(57) ABSTRACT

A data channel includes a power constrained first channel portion to receive energy from a limited power source and a non-power constrained second channel portion to receive energy from a different power source than the first channel portion. The first channel portion includes an ADC circuit to output an ADC data sample, a first transmitter circuit configured to serially transmit data that includes ON bits and OFF bits, and logic circuitry configured to derive transmit data from the ADC data sample. The transmitter circuit uses more energy transmitting the ON bits than the OFF bits, and the derived transmit data has a reduced number of the ON bits from the ADC data sample. The second channel portion includes a first receiver circuit to receive the derived transmit data from the first transmitter circuit of the first channel portion.

24 Claims, 9 Drawing Sheets

FIG. 11

POWER SAVING ENCODING FOR ISOLATED GALVANICALLY DATA TRANSMISSION

CLAIM OF PRIORITY

This application claims priority to U.S. Provisional Application No. 63/342,237, filed May 16, 2022, which is hereby incorporated by reference herein in its entirety.

FIELD OF THE DISCLOSURE

This document relates to integrated circuits and in particular to analog-to-digital converter (ADC) circuits.

BACKGROUND

ADCs can be used to quantify an analog signal as a digital quantity that can be used in signal processing. The data provided by ADC circuits can be used to quantify the output of sensor circuits to monitor the operational state of a system. The monitoring circuits can be included in circuitry that is power constrained, i.e., the circuitry is supplied with energy from a limited power source such as a photocell for example. The power constrained circuitry is designed to draw power within limits to avoid overloading the power source. This power constraint limits the amount of data that can be obtained by a data acquisition circuit.

Using higher resolution ADCs (e.g., 14-16 bit ADCs) would increase the amount of data available but sending data from higher resolution ADCs at more than a mega-sample per second (MSPS) would require a significant amount of current which would adversely impact operation of a power constrained system. For example, in some motor inverters, the amount of current available is limited to only a few milliamps (mA). Increasing the current required to send data would pose a significant challenge to the system. Even with slower higher resolution ADCs, the current needed may negatively impact an extremely low power application. A low energy data transmission approach would allow use of higher resolution ADCs at MSPS for lower latency and higher dynamic range.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
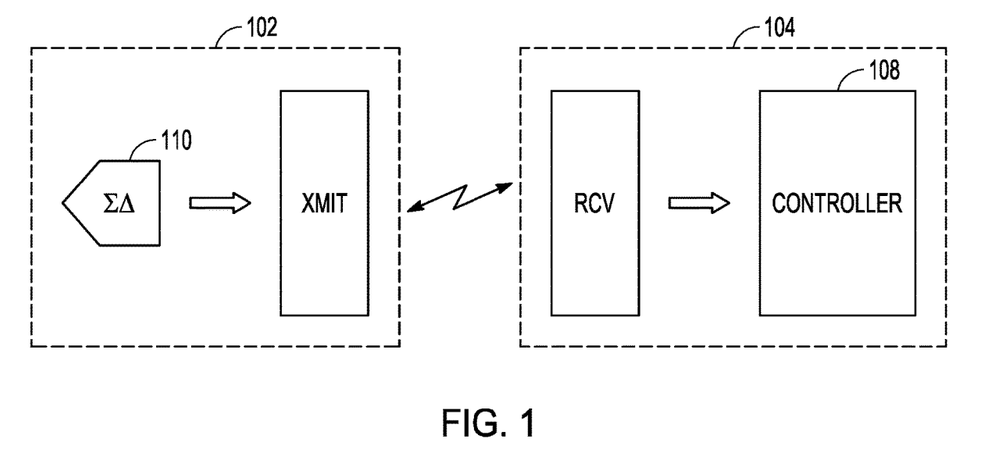
FIG. 1 is a block diagram of an example of a data acquisition system.

FIG. 1 is a block diagram of an example of a data acquisition system having a power constrained portion 102 and a non-power constrained portion 104. Data samples are obtained in the power constrained portion 102 of the system and sent across an isolation barrier to control circuitry 108 that monitors the state of the system and makes decisions on operation of the system. Power constrained systems impose challenges on the data acquisition devices used in the systems.

One approach for data acquisition in a power constrained system is to use a data converter that codes the signal as a single bit oversampled data stream. For instance, a sigma delta ($\Sigma\Delta$) modulator 110 can be used for data acquisition in the system of FIG. 1. The sigma delta modulator 110 converts an input signal into a continuous serial stream of ones and zeros at a rate determined by a sampling clock frequency $Kf_s$, where $f_s$ is the effective sampling frequency of the digitized high-resolution signal and K is an oversampling ratio. The high-resolution output represents the input voltage and is calculated from K samples of the input voltage. This approach may involve latency and a limited dynamic range when it is desired to achieve a higher effective sample rate $f_s$. Using a Nyquist-rate ADC would reduce latency and increase dynamic range. A successive approximation analog-to-digital converter (SAR ADC) is an example of a Nyquist-rate ADC.

Figure 2:
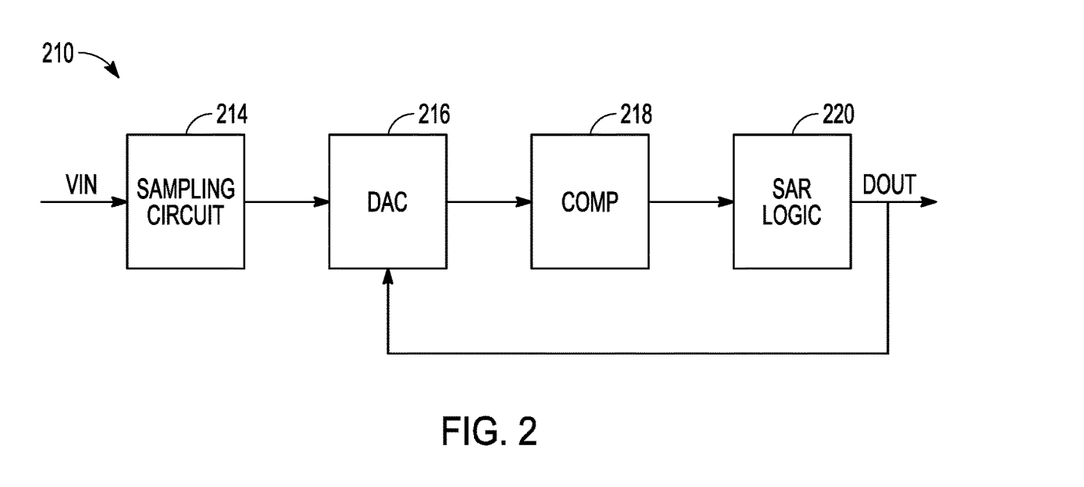
FIG. 2 is a functional block diagram of an example of a successive approximation analog-to-digital converter.

FIG. 2 is a functional block diagram of an example of an SAR ADC 210. The SAR ADC 210 includes a sampling circuit 214, a digital-to-analog converter (DAC) circuit 216 operatively coupled to the sampling circuit 214, a comparator circuit 218, and logic circuitry 220. In the example of FIG. 2, an input voltage VIN is sampled using sampling circuit 214. A differential output voltage of the DAC circuit 216 is compared to the sampled voltage using comparator circuit 218. The bit values of the DAC circuit 216 are adjusted based on the output of the comparator circuit. The conversion may start with the DAC set to midscale. The comparator circuit 218 determines whether the DAC output is greater or less than a specified threshold voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. Logic circuitry 220 controls the ADC operation during the bit trials. When the bit trials are complete, the digital value of the sampled and held voltage is available at output $D_{OUT}$.

In the system of FIG. 1, using a Nyquist-rate ADC such as an SAR ADC instead of the sigma-delta modulator 110 would reduce latency and increase dynamic range. For example, high resolution SAR ADCs can output a 14-16 bit digital value. However, there are challenges in using a Nyquist-rate ADC in the system of FIG. 1.

One challenge is that the data rate from the power constrained portion to the non-power constrained portion increases because the number of samples to transfer increases. This may increase the current consumption on the power constrained portion of the system beyond acceptable limits. Another challenge is that data transfer errors from the power constrained portion to the non-power constrained portion have a large impact on the system. Errors in the ADC samples received on the non-power constrained portion 104 can result in malfunction of the control circuitry 108 when it receives this data.

Figure 3:
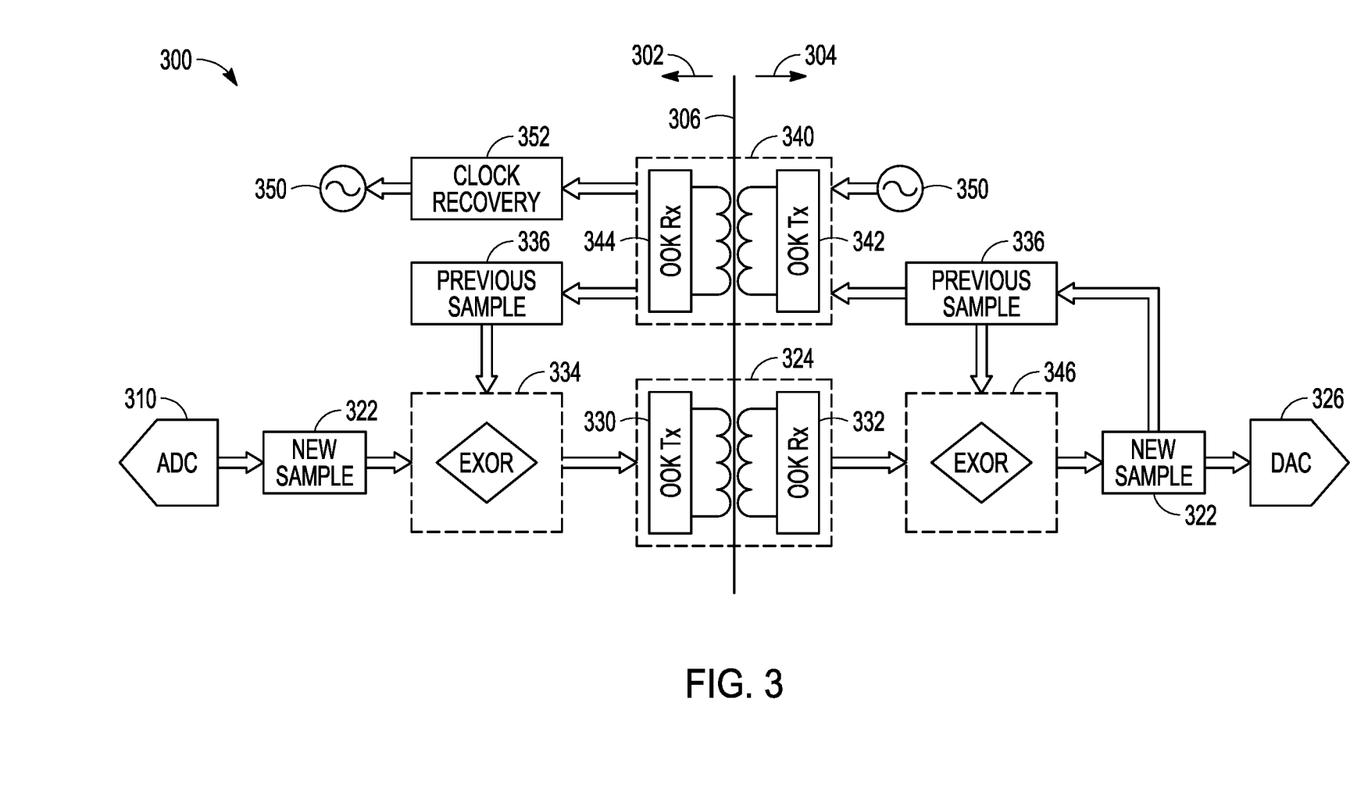
FIG. 3 is a block diagram of an example of a data channel.

FIG. 3 is a block diagram of an example of a data channel 300. The data channel 300 includes an isolated data link. The data channel 300 includes a power constrained portion 302 of the channel isolated from a non-power constrained portion 304 of the channel by an electrical isolation barrier 306. The power constrained portion of the channel receives energy from a limited power source, and the non-power constrained portion 304 of the channel receives energy from a different power source that is not limited or at least is not as limited as the power source of the power constrained portion. The isolation barrier 306 may provide galvanic isolation between the power constrained portion 302 of the channel and the non-power constrained portion 304 of the channel.

The power constrained portion 302 uses an isolated Nyquist-rate ADC circuit 310 (e.g., an SAR ADC circuit) for data acquisition and provides low power transmission of data across the isolation barrier 306. The ADC circuit 310 samples an analog signal and outputs ADC data samples 322. The ADC data samples 322 are sent via a forward data channel 324 to a DAC circuit 326 that converts the ADC data samples back to an analog signal.

The forward data channel 324 includes a transmitter circuit 330 on the power constrained portion and a receiver circuit 332 located on the non-power constrained portion and isolated from the transmitter circuit 330 by the isolation barrier 306. The transmitter circuit 330 may send data serially. For example, the transmitter circuit 330 may include a transmit register that is loaded in parallel with transmit data and the contents of the transmit register are sent serially to the receiver circuit 332.

The isolation barrier 306 may include layers of polyimide and the isolated data link may include chip scale transformer coils. On-Off Keying (OOK) of the transmitter side coil creates a detectable response in the receiver side coil. In variations, the isolated data link may include an optical link that includes a laser emitting diode in the transmitter circuit 330 and a photosensor in the receiver circuit. Optical OOK can be used to transmit data across the isolation barrier 306.

Certain bits (e.g., 1 bits) in the transmit register are ON bits and the transmitter circuit 330 uses energy to transmit an ON bit during a predetermined bit time. OFF bits (e.g., 0 bits) in the transmit register are indicated by no energy being communicated on the physical data link during a predetermined bit time. The absence of energy on the physical data link during the bit time indicates that the bit is an OFF bit. Because more energy is used by the power constrained transmitter circuit 330 in transmitting ON bits, energy can be conserved by reducing the amount of ON bits being transmitted by the forward data channel 324. Alternatively, this approach could be reversed with ON bits corresponding to the 0 bits of the transmit register and OFF bits corresponding to the 1 bits of the transmit register.

The data channel 300 includes logic circuitry 334 that derives transmit data from the ADC data samples. The transmit data has a reduced number of ON bits from the ADC data samples. In some embodiments, the logic circuit circuitry 334 derives the transmit data by comparing the current ADC data sample 322 and the previous ADC data sample 336 and only including ON bits in the transmit data for bit positions where the bit value changed.

Figure 4:
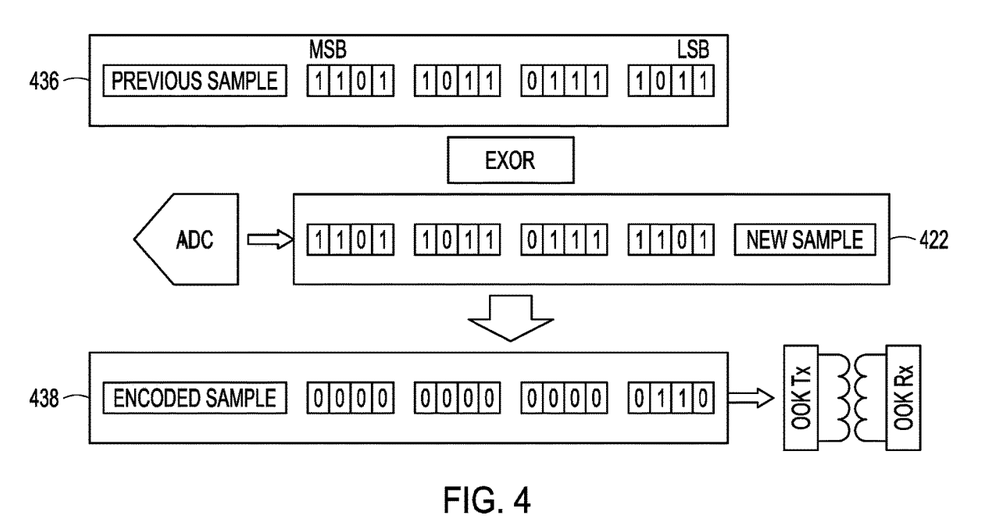
FIG. 4 is an illustration of an example of generating transmit data.

FIG. 4 is an illustration of an example of generating the transmit data using a new ADC data sample 422 and the previous ADC data sample 436. For both the new and previous data samples, the least significant bit (LSB) is shown on the right and the most significant bit (MSB) is on the left. The logic circuitry 334 of FIG. 3 includes exclusive or (EXOR) logic and encoded transmit data 438 is generated by the EXOR of the new ADC data sample 422 and the previous ADC data sample 436. The example shows that the number of ON bits in the encoded transmit data 438 is reduced to only two ON bits. By the receiving side having knowledge of the previous ADC data sample, the amount of information in the transmit data is the same even though the number of ON bits in the data is reduced.

Any transmission error in the received data sample can be corrected for in the new encoded data sample. For example, if the MSB bit in the previous data sample had become zero due to a transmission error, the MSB bit in the encoded data sample will be set. Thereby enabling the receiver side to detect and correct the error in the next data sample. Individual samples may still contain an error, but no error accumulation can occur. Hence the average of the errors is zero. Data sent from the non-power constrained side to the power constrained side is substantially less prone to data transfer errors, because the signal can carry more power and can include redundancy in the data.

Figure 5:
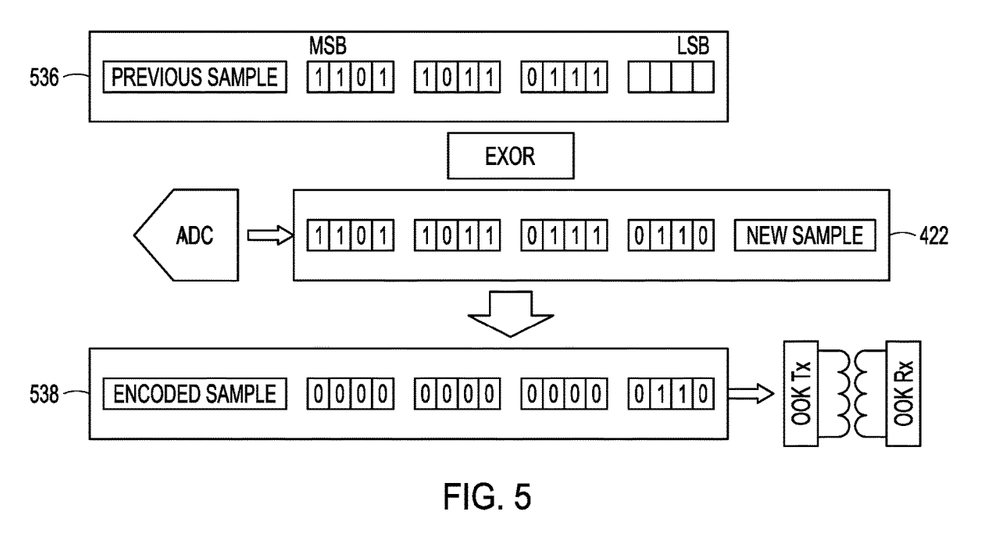
FIG. 5 is an illustration of another example of generating transmit data.

FIG. 5 is an illustration of another example of deriving the transmit data using the new ADC data sample 422 and a previous ADC data sample 536. Encoded transmit data 538 is generated by the EXOR of the new ADC data sample 422 and the previous ADC data sample 536. Depending on the application, the MSBs of the ADC data samples may change more slowly than the LSBs. The EXOR logic circuitry 334 in FIG. 3 can be simplified or reduced to not include the LSBs in the comparison between samples and some of the LSBs (e.g., the four LSBs) are simply transmitted. Reducing the number of data bits transmitted can reduce the bandwidth needed for the forward channel. Alternatively, reducing the number of data bits transmitted can allow for more control bits to be sent across by the forward channel or for timing bits to be sent to allow for clock synchronization or to improve precision in the sample time.

Returning to FIG. 3, the encoded transmit data is received by the receiver circuit 332, and the non-power constrained portion 304 of the data channel includes logic circuitry 346 to recover the current ADC data sample 322 on the non-power constrained portion 304 of the data channel 300. The previous data sample 336 may be saved on the power constrained portion 302 for use in generating the transmit data and for use in correcting transmission errors.

In some examples, the power constrained portion 302 receives the previous ADC data sample 336 from the non-power constrained portion 304. The data channel 300 in the example of FIG. 3 includes a back data channel 340. The back data channel 340 includes a second transmitter circuit 342 located in the non-power constrained portion 304 of the data channel 300 and a second receiver circuit 344 located in the power constrained portion 302 of the data channel 300. The second receiver circuit 344 is electrically isolated from the second transmitter 342 circuit by the isolation barrier 306. The previous ADC data sample 336 is sent back from non-power constrained portion 304 and used by the logic circuitry 334 to generate the transmit data. An unencoded recovered ADC data sample can be sent back by the back data channel 340 because the second transmitter circuit 342 is not power constrained. Sending back the previous sample may be a more reliable approach if errors in the previous sample cannot be detected on the power constrained portion 302 of the channel.

Transmitting back the previous data sample may provide other advantages. For example, the second transmitter circuit 342 on the non-power constrained portion 304 uses a clock signal 350 for timing to send data via the back data channel 340. Clock recovery circuitry 352 on the power constrained portion 302 may recover the clock signal 350 without the clock signal or a clock synchronization signal having to be transmitted over the isolated data link. It also eliminates the need for a separate dedicated clock channel. The clock recovery circuitry 352 may include logic circuitry to recover the clock signal using data edges of the received data. In some examples, the clock recovery circuitry includes phase locked loop (PLL) circuitry. The recovered clock signal can be used to operate the ADC circuit 310. In some examples, the power constrained portion 302 includes logic circuitry that derives a sample time for the ADC circuit 310 from the data transmitted via the back data channel 340.

Figure 6:
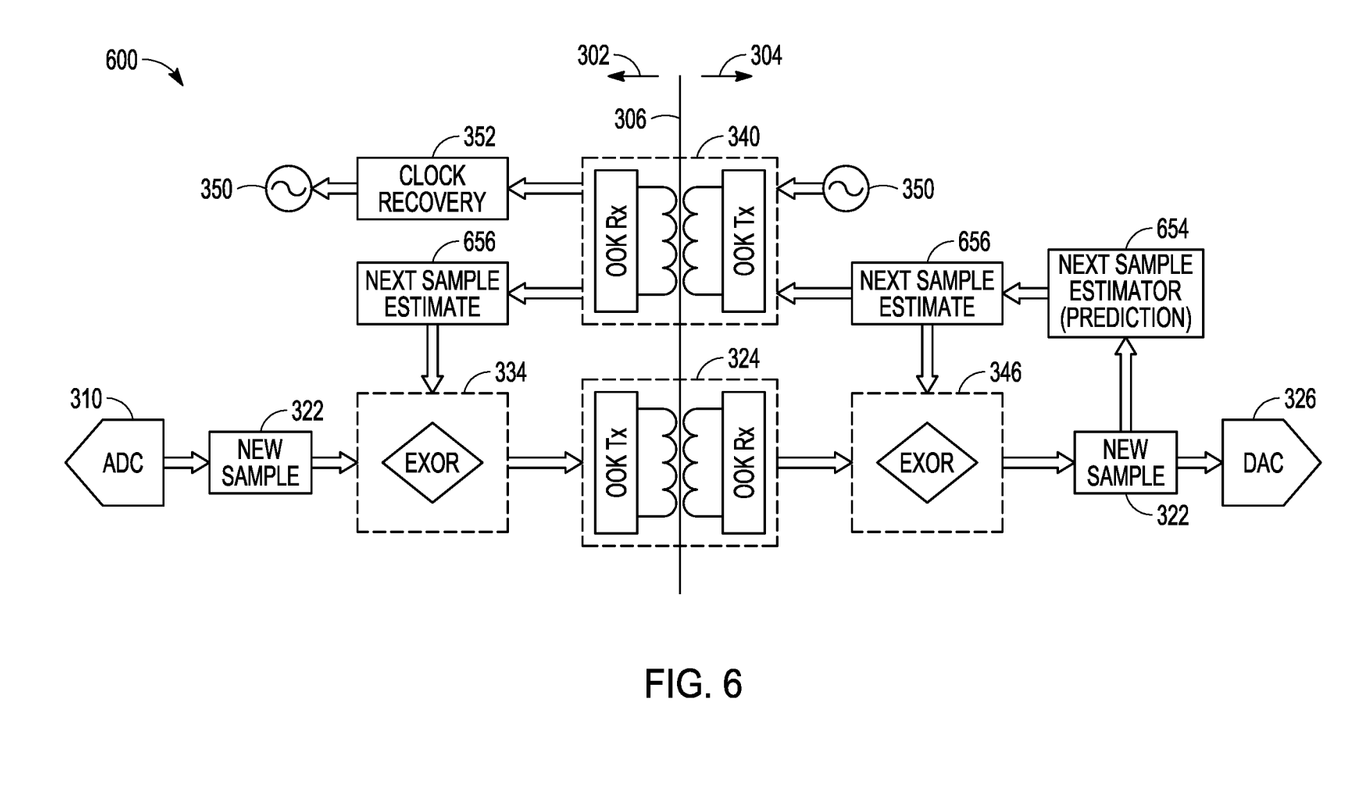
FIGS. 6-9 are block diagrams of further examples of data channels.

FIG. 6 is a block diagram of another example of a data channel 600. The data channel is similar to the example of FIG. 3 in that the data channel uses an isolated Nyquist-rate ADC circuit 310 and provides low power transmission of data across an isolation barrier 306. The data channel of FIG. 6 is different from the example of FIG. 3 in that an estimate or a prediction of the next data sample output by the ADC circuit 310 is used to generate the transmit data instead of a previous data sample. The transmit data sent by the forward data channel 324 is generated by the logic circuitry 334 using the new ADC data sample 322 and the estimate 656 of the next ADC data sample. The transmit data only includes ON bits in the transmit data for bit positions where the bit value of the new ADC data sample 322 is different from the next ADC data sample estimate 656. The logic circuitry 334 may include EXOR logic to generate the transmit data from the new ADC data sample 322 and the next ADC data sample estimate 656.

The non-power constrained portion 304 of the data channel 600 may include estimator logic circuitry 654 that generates the next ADC data sample estimate 656. In certain examples, the estimator logic circuitry 654 includes logic that extrapolates from the current ADC data sample and one or more previous ADC data samples to estimate the next ADC data sample. In certain examples, the estimator logic circuitry 654 includes a digital low pass filter that estimates the next ADC data sample. In certain examples, the estimator logic circuitry 654 includes digital prediction logic that estimates the next ADC data sample. The digital prediction logic may take into the difference between the actual sample and the estimate of that sample to adjust its prediction of subsequent samples.

The back data channel 340 may be used to transmit the next ADC data sample estimate 656 to the power constrained portion 302 of the data channel 600. In certain examples, the estimator logic circuitry 654 is also located on the power constrained portion 302 of the data channel 600, and the next ADC data sample estimate 656 can be generated on the power constrained portion without having to send the next ADC data sample estimate 656 over the back data channel 340. However, as explained previously herein, there may be advantages to sending the next ADC data sample estimate 656 over the back data channel 340 such as clock signal 350 recovery and error detection on the non-power constrained portion 304 of the channel.

Figure 7:
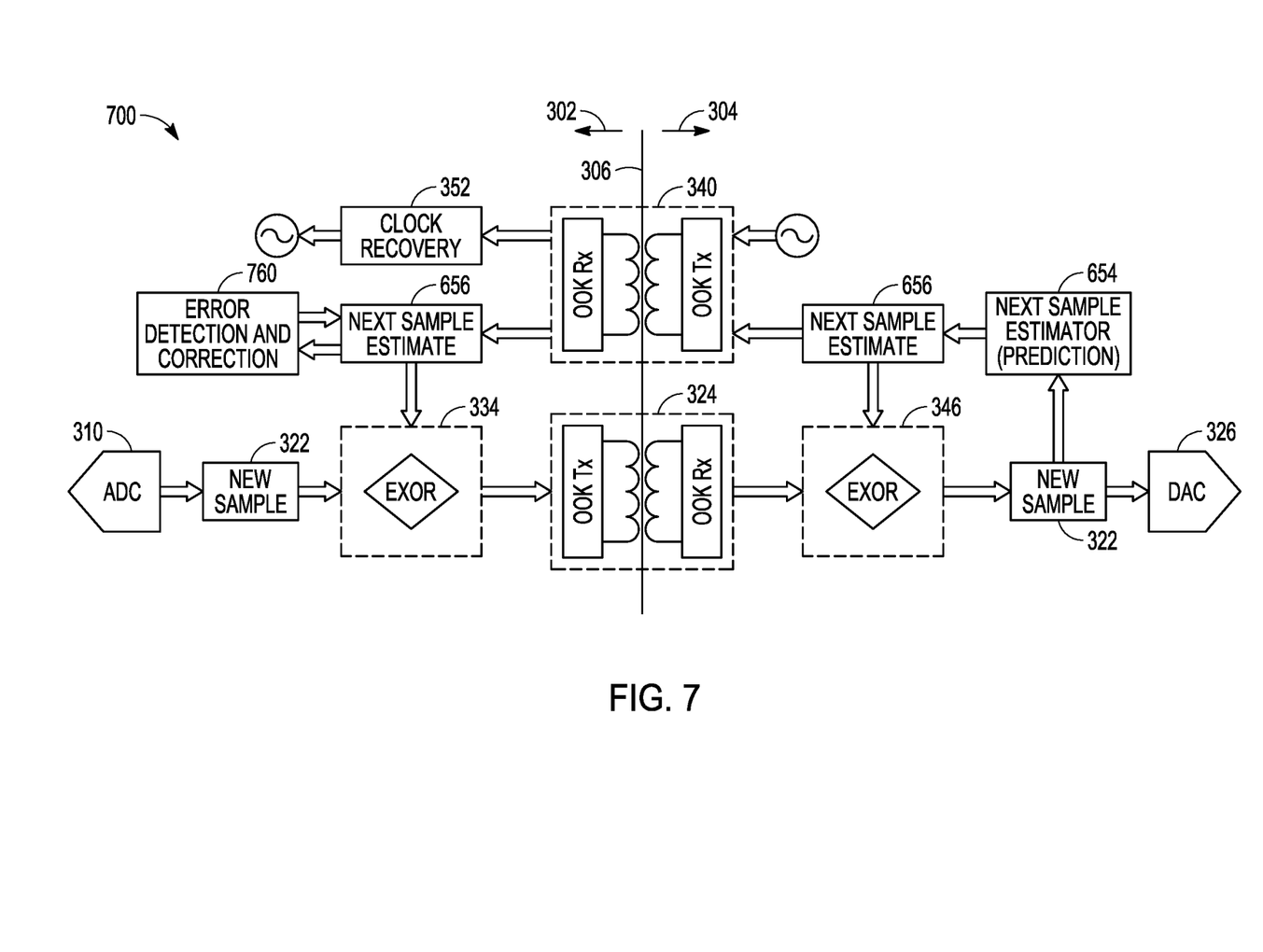

FIG. 7 is a block diagram of another example of a data channel 700. The data channel 700 is similar to the example of FIG. 6 in that the data channel 700 uses an isolated Nyquist-rate ADC circuit 310 for data acquisition and provides low power transmission of ADC data samples 322 across an isolation barrier 306. A next ADC data sample estimate 656 of the next ADC data sample output by the ADC circuit 310 is used to generate encoded transmit data. The estimator logic circuitry 654 that produces the data sample estimate 656 may be located on the non-power constrained portion 304 of the data channel or on both the non-power constrained portion 304 and the power constrained portion 302 of the data channel 700.

In the example of FIG. 7, the power constrained portion 302 of the data channel 700 includes logic circuitry 760 that detects errors in both transmitted and received data and, in some examples, may also correct errors in the next ADC data sample estimate 656. Logic circuitry 334 compares the new current ADC data sample 322 and an error corrected estimated ADC data sample 656 and generates transmit data that only includes ON bits in bit positions where the current ADC data sample differs from the error corrected ADC data sample estimate 656. Logic circuitry 346 recovers the new ADC data sample 322 from the encoded transmit data.

The descriptions of the examples of FIGS. 3, 6, and 7 include references to logic circuitry 334 and 346 that uses EXOR logic to compare new ADC data samples 322 with previous ADC data samples, estimates of the new ADC data samples, and error corrected estimates of the new ADC data samples. Other approaches to the logic circuitry may be used.

Figure 8:
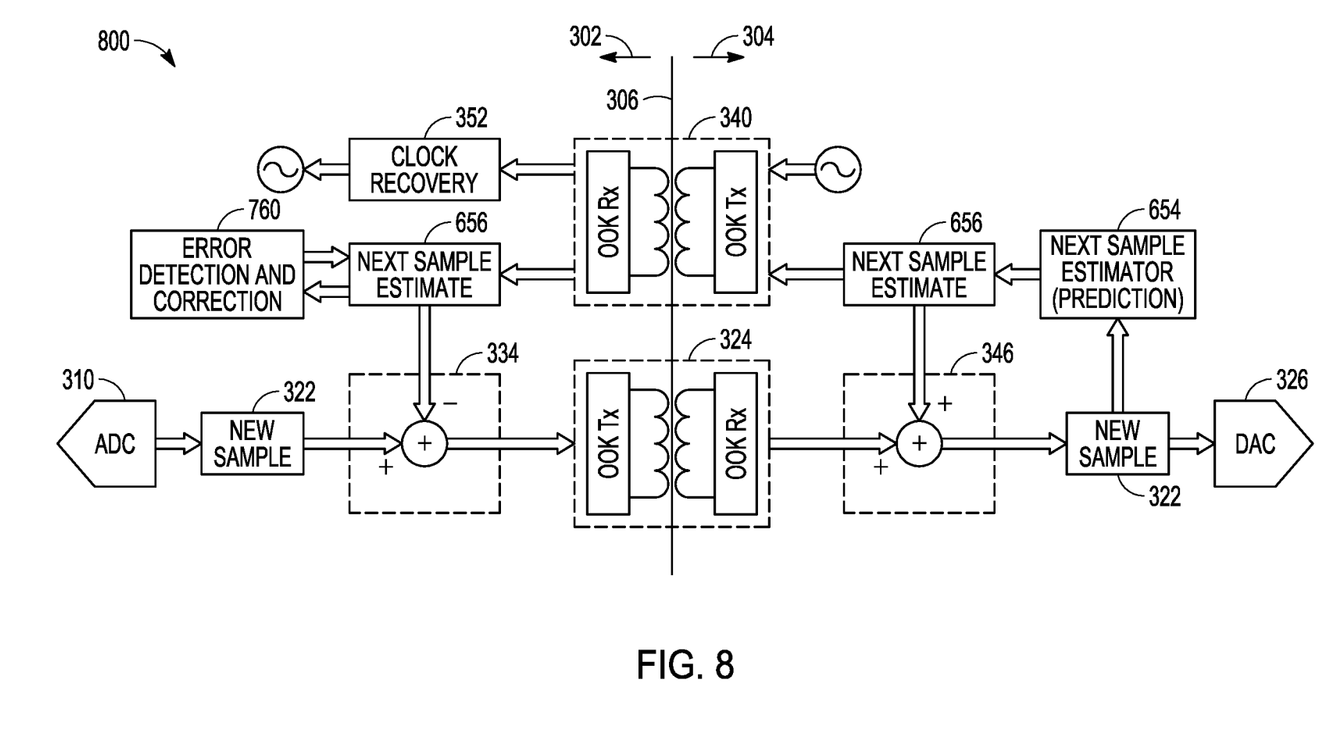

FIG. 8 is a block diagram of another example of a data channel 800. The data channel is similar to the example of FIG. 7, except that the logic circuitry 334 of the power constrained portion 302 includes an adder circuit (+) and a subtractor circuit (−), and the logic circuitry 346 of the non-power constrained portion 304 includes two adder circuits (+). The adding and subtracting by logic circuitry 334 produces transmit data that includes ON bits at the bit positions where the next data sample estimate 656 differs from the new ADC data sample 322. The adding of the transmit data and the next data sample estimate 656 by logic circuitry 346 recovers the new ADC data sample 322. The adding and subtracting logic can also be used to generate transmit data from the new ADC data sample 322 and the previous ADC data sample 336 in the example of FIG. 3 and recover the new ADC data sample 322 using the transmit data.

Figure 9:
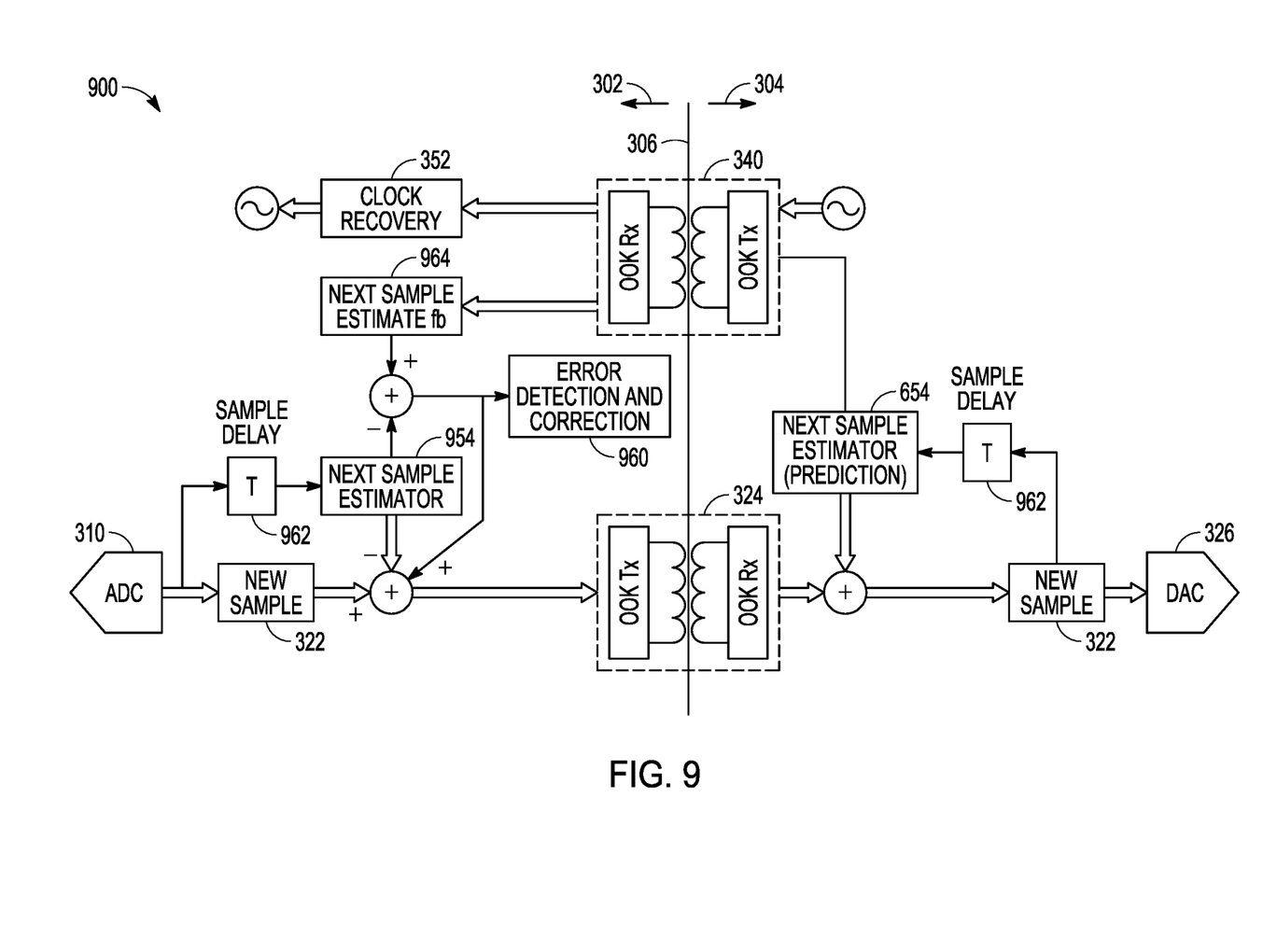

FIG. 9 is a block diagram of another example of a data channel 900. The example of FIG. 9 adds feedback error correction to the next data sample estimation. The non-power constrained portion 304 of the data channel 900 includes a delay circuit 962. The delay circuit 962 adds a sample delay to the recovered ADC data sample 322. The sample delay may be one data sample cycle of the ADC circuit 310. The estimator logic circuitry 654 provides a feedback estimate 964 of the next ADC data sample to the power constrained portion 302 via the back data channel 340.

The logic circuitry on the power constrained portion 302 of the data channel 900 also includes a delay circuit 962 and estimator logic circuitry 954. The delay circuit 962 adds a sample delay to the output of the ADC circuit 310 and the estimator logic circuitry 954 produces an estimate of the next ADC data sample using the delayed ADC data sample. Error detection circuitry 960 compares the estimate of the next ADC data sample to the feedback estimate 964 and determines errors between the estimates. The logic circuitry includes a subtractor circuit and an adder circuit. The logic circuitry generates transmit data by subtracting the estimate of the current ADC data sample from the current ADC data sample 322 and adding the errors determined by the error detection circuitry 960. The result is sent to the non-power constrained portion 304 via the forward data channel 324.

Figure 10:
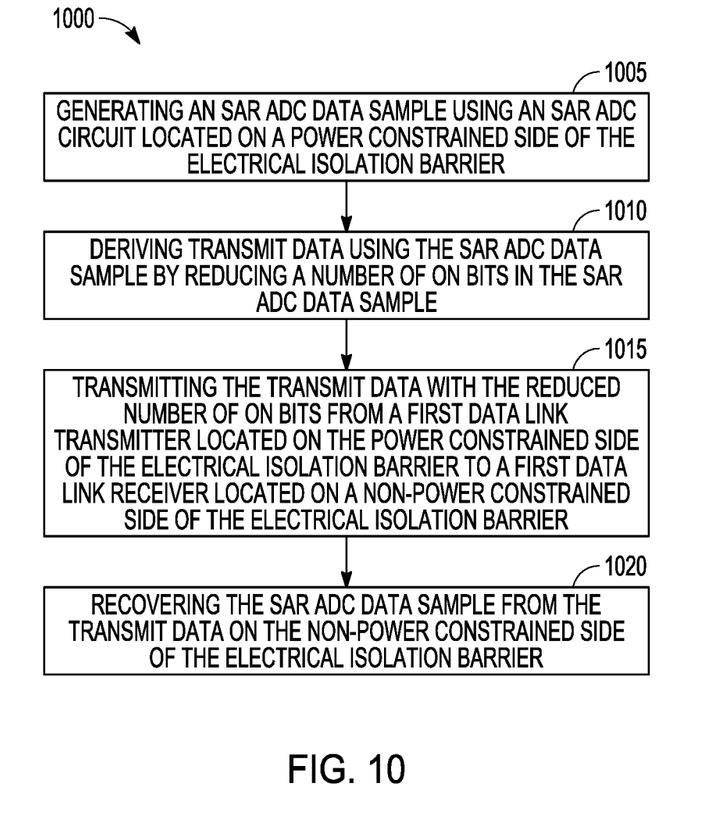
FIG. 10 is a flow diagram of a method of operating a data link to transmit data across an electrical isolation barrier.

For completeness, FIG. 10 is a flow diagram of a method 1000 of operating a data channel to transmit data from a power constrained portion of the data channel to the non-power constrained portion of the data channel. The power constrained portion may be isolated from the non-power constrained portion by an electrical isolation barrier. The method 1000 can be performed using any of the circuits in FIGS. 3 and 6-9.

At block 1005, an ADC data sample is generated using an ADC circuit located in the power constrained portion of the data channel. Transmit data is sent across the electrical isolation barrier using a forward data channel transmitter located on the power constrained portion. The forward data channel transmitter uses more energy to transmit ON bits than to transmit OFF bits.

At block 1010, transmit data is derived using the ADC data sample by reducing the number of ON bits in the ADC data sample. This reduces the energy needed to transmit the ADC data sample from the power constrained portion of the data channel. At 1015, the derived transmit data is transmit by the forward data channel transmitter located in the power constrained portion of the data channel to the forward data channel receiver located in the non-power constrained portion of the data channel.

At block 1015, the ADC data sample is recovered from the transmit data received by the non-power constrained portion of the data channel. Multiple ADC circuits can be located in the power constrained portion. The power constrained circuitry may include a multiplexer circuit that multiplexes ADC data samples from the multiple ADC circuits to the forward data channel for transmitting. A demultiplexer may be located in the non-power constrained circuitry. The ADC data samples may be provided to multiple DAC circuits to recover multiple analog signals sampled by the power constrained circuitry.

Figure 11:
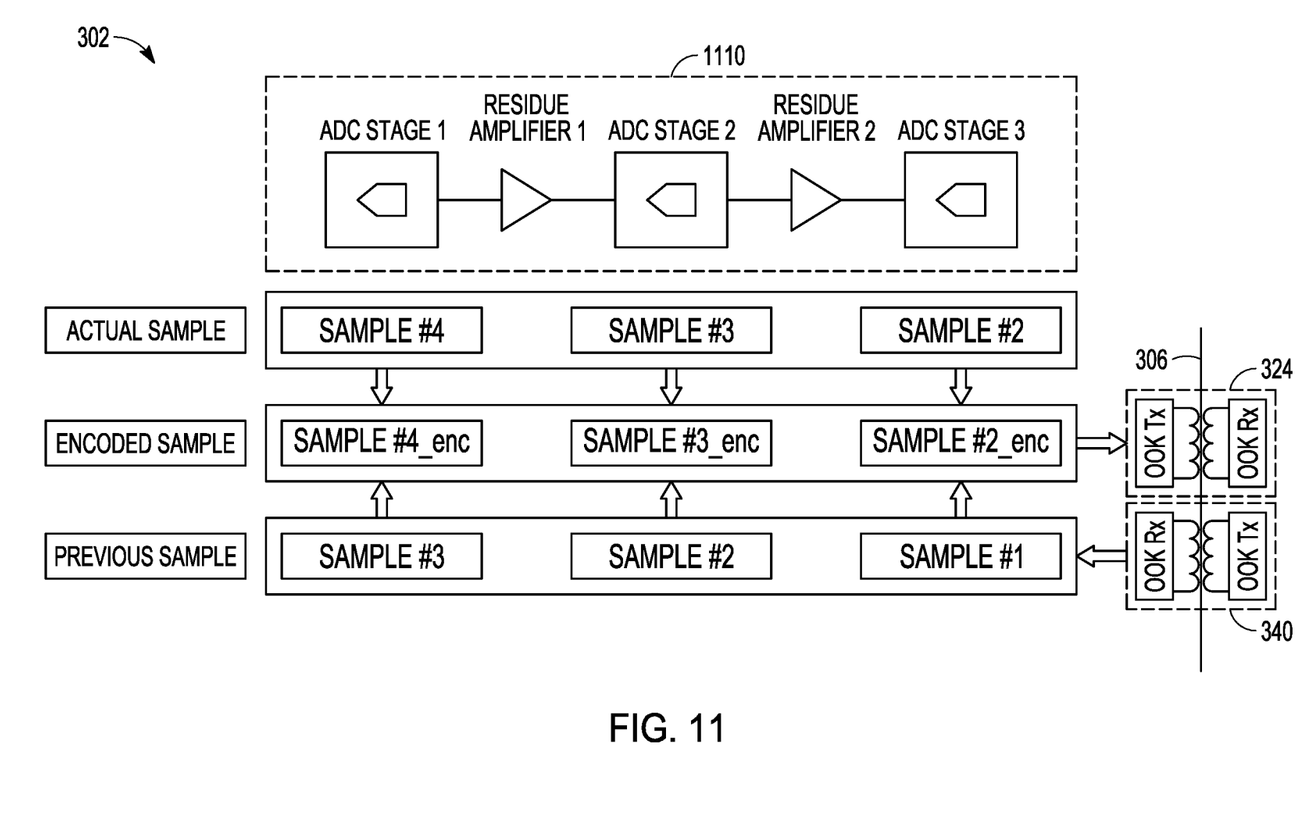
FIG. 11 is a block diagram of portions of another example of a data channel.

FIG. 11 is a block diagram of portions of another example of a data channel. The block diagram shows a forward data channel 324 and a back data channel 340. The data channel includes an isolated multi-stage ADC circuit 1110 in the power constrained portion 302 of the data channel. In the example, the multi-stage ADC circuit 1110 is a three-stage ADC circuit. To complete the full ADC data sample, it takes three samples to complete the result.

A first stage partial result of the ADC data sample is available before the complete result is available. In the example of FIG. 11, at each of the partial stage results, the encoded transmit data is derived from the previous partial result (Samples 1-3) and the current result with the next partial result completed (Samples 2-4), e.g., by EXORing or adding the previous partial result and the current partial result to reduce the number of ON bits.

The first stage partial result can be transmitted immediately to the non-power constrained portion for a coarse analysis by control circuitry (e.g., to detect an overrange or overcurrent event). Because the data is analyzed before the three-stage result is completed, the response time is significantly improved in resolving an issues detected by control circuitry of the non-power constrained portion of the data channel.

The devices, systems and methods described herein reduces the energy used to transmit data across an electrical isolation barrier using the power constrained circuitry. Reducing the energy needed to transmit the ADC data allows use of the Nyquist rate ADC circuit to sample data with the power constrained circuitry.

ADDITIONAL DESCRIPTION AND ASPECTS

A first Aspect (Aspect 1) includes subject matter (such as a data channel) comprising a power constrained first channel portion to receive energy from a limited power source and a non-power constrained second channel portion to receive energy from a different power source than the first channel portion. The first channel portion includes an analog-to-digital converter (ADC) circuit to output an ADC data sample; a first transmitter circuit configured to serially transmit data that includes ON bits and OFF bits, wherein the first transmitter circuit uses more energy transmitting the ON bits than the OFF bits; and logic circuitry configured to derive transmit data from the ADC data sample, wherein the derived transmit data has a reduced number of the ON bits from the ADC data sample. The non-power constrained second channel portion includes a first receiver circuit to receive the derived transmit data from the first transmitter circuit of the first channel portion.

In Aspect 2, the subject matter of Aspect 1 optionally includes a successive approximation register (SAR) ADC circuit and an isolation barrier arranged to electrically isolate the first channel portion that includes the SAR ADC circuit and the first transmitter circuit from the second channel portion that includes the first receiver circuit.

In Aspect 3, the subject matter of one or both of Aspects 1 and 2 optionally includes a second transmitter circuit disposed in the second channel portion; a second receiver circuit disposed in the first channel portion, operatively coupled to the logic circuitry of the first channel portion, and configured to receive data from the second transmitter circuit disposed in the second channel portion; and clock recovery circuitry disposed in the first channel portion and configured to derive a clock signal from receive data received via the second receiver circuit, wherein the ADC circuit operates according to the derived clock signal.

In Aspect 4, the subject matter of Aspect 3 optionally includes a first channel portion including logic circuitry configured to receive a previous ADC data sample via the second receiver circuit, compare a current ADC data sample and the previous ADC data sample, and provide transmit data to the first transmitter circuit that only includes ON bits in bit positions where the current ADC data sample differs from the previous ADC data sample.

In Aspect 5, the subject matter of Aspect 3 optionally includes a first channel portion including logic circuitry configured to receive an estimated ADC data sample, via the second receiver circuit, that is an estimate of a current ADC data sample, compare the current ADC data sample and the received estimated ADC data sample, and provide transmit data to the first transmitter circuit that only includes ON bits in bit positions where the current ADC data sample differs from the estimated ADC data sample.

In Aspect 6, the subject matter of Aspect 5 optionally includes a first channel portion including logic circuitry configured to detect errors in the estimated ADC data sample and compare the current ADC data sample and an error corrected estimated ADC data sample.

In Aspect 7, the subject matter of one or any combination of Aspects 1-6 optionally includes includes a first channel portion including logic circuitry configured to receive an estimated ADC data sample, via the second receiver circuit, that is an estimate of a current ADC data sample, determine errors in an estimated ADC data sample that is an estimate of a current ADC data sample, and provide transmit data to the first transmitter circuit that only includes ON bits in bit positions of errors in the estimated ADC data sample.

In Aspect 8, the subject matter of one or any combination of Aspects 1-7 optionally includes a first channel portion including logic circuitry configured to derive the transmit data from an exclusive or (EXOR) of a current ADC data sample and one of a previous ADC data sample or an estimate of the current ADC data sample.

In Aspect 9, the subject matter of one or any combination of Aspects 1-8 optionally includes an adder circuit located in the second channel portion, and a first channel portion including a subtractor circuit and logic circuitry configured to derive the transmit data by subtraction of a current ADC data sample and one of a previous ADC data sample or an estimate of the current ADC data sample. The adder circuit adds the one of the previous ADC data sample or the estimate of the current ADC data sample to the transmit data received by the first receiver circuit of the second channel portion to recover the current ADC sample from the transmit data.

In Aspect 10, the subject matter of one or any combination of Aspects 1-9 optionally includes a second channel including a second transmitter circuit and, logic circuitry configured to recover a current ADC data sample from the transmit data, a delay circuit configured to delay the recovered current ADC data sample, and logic circuitry configured to generate a feedback estimate of the recovered current ADC data sample. The first channel portion includes a a second receiver circuit configured to receive a feedback estimate of the recovered current ADC data sample from the second transmitter circuit, and logic circuitry including a second delay circuit configured to delay the current ADC data sample, estimator circuitry configured to produce an estimate of the current ADC data sample using the delayed current ADC data sample, error detection circuitry configured to determine errors between the estimate of the current ADC data sample and the feedback estimate of the current ADC data sample, and a subtractor circuit and adder circuit, and the logic circuitry of the first channel portion is configured to generate the transmit data by subtracting the estimate of the current ADC data sample from the current data sample and adding the determined errors.

In Aspect 11, the logic circuitry of one or any combination of Aspects 1-10 optionally includes a galvanic isolation barrier arranged to electrically isolate the first channel portion that includes the ADC circuit and the first transmitter circuit from the second channel portion that includes the first receiver circuit, and a digital-to-analog converter (DAC) circuit located in the second channel portion and operatively coupled to the first receiver circuit.

Aspect 12 includes subject matter (such as a method of operating a data channel to transmit data between a power constrained first channel portion and a non-power constrained second channel portion) or can optionally be combined with one or any combination of Aspects 1-11 to include such subject matter, comprising generating an analog-to-digital converter (ADC) data sample using an ADC circuit located in the first channel portion, deriving transmit data from the ADC data sample by reducing a number of ON bits in the ADC data sample, wherein more energy is used by the data channel in transmitting the ON bits than transmitting OFF bits, transmitting the transmit data with the reduced number of ON bits from a first transmitter located in the first channel portion to a first receiver located in the second channel portion, and recovering the ADC data sample from the transmit data in the second channel portion.

In Aspect 13, the subject matter of Aspect 12 optionally includes generating a successive approximation register analog-to-digital converter (SAR ADC) data sample using an SAR ADC circuit located in the first channel portion and transmitting the transmit data from the first transmitter located in the first channel portion across an electrical isolation barrier to the first receiver located in the second channel portion.

In Aspect 14, the subject matter of one or both of Aspects 12 and 13 optionally includes receiving data using a second receiver located in the first channel portion, deriving a clock signal using the received data, and determining a sample time for the ADC circuit using the derived clock signal.

In Aspect 15, the subject matter of one or any combination of Aspects 12-14 optionally includes transmitting a previous ADC data sample from a second transmitter located in the second channel portion to a second receiver located in the first channel portion, comparing a current ADC data sample and the previous ADC data sample, and generating transmit data that only includes the ON bits in bit positions where the current ADC data sample differs from the previous ADC data sample.

In Aspect 16, the subject matter of one or any combination of Aspects 12-15 optionally includes transmitting an estimated ADC data sample from a second transmitter located in the second channel portion to a second receiver located in the first channel portion; comparing a current ADC data sample and the estimated ADC data sample, wherein the estimated ADC circuit is an estimate of the current ADC data sample; and generating transmit data that only includes the ON bits in bit positions where the current ADC data sample differs from the estimated ADC data sample.

In Aspect 17, the subject matter of Aspect 16 optionally includes detecting errors in the estimated ADC data sample, comparing the current ADC data sample and an error corrected estimated ADC data sample, and generating transmit data that only includes the ON bits in bit positions where the current ADC data sample differs from the error corrected estimated ADC data sample.

In Aspect 18, the subject matter of one or any combination of Aspects 12-17 optionally includes delaying an ADC data sample in the first channel portion of the data channel and producing an estimate of the current ADC data sample using the delayed ADC data sample, delaying a recovered ADC data sample in the second channel portion of the data link and producing a feedback estimate of the current ADC data sample using the delayed recovered ADC data sample, transmitting the feedback estimate of the current ADC data sample from a second transmitter located in the second channel portion to a second receiver located in the first channel portion, determining errors between the estimate of the current ADC data sample and the feedback estimate of the current ADC data sample, and generating the transmit data by subtracting the estimate of the current ADC data sample from the current ADC data sample and adding the determined errors.

In Aspect 19, the subject matter of one or any combination of Aspects 12-18 optionally includes generating a first partial ADC data sample using a first stage of a multi-stage ADC circuit located in the first channel portion, deriving first partial transmit data by reducing the number of ON bits in the first partial ADC data prior to generating a complete ADC data sample, transmitting the first partial transmit data to the first receiver of the second channel portion prior to deriving transmit data for the complete ADC data sample.

In Aspect 20, the subject matter of Aspect 19 optionally includes receiving a previous partial data sample of a previous complete ADC data sample using a second receiver located in the first channel portion of the data link, comparing a current partial ADC data sample and the previous partial ADC data sample, and generating partial transmit data that only includes the ON bits in bit positions where the current partial ADC data sample differs from the previous partial ADC data sample.

Aspect 21 includes subject matter (such as a data acquisition system) or can optionally be combined with one or any combination of Aspects 1-20 to include such subject matter, comprising a power constrained portion of the system separated from a non-power constrained portion of the system by an electrical isolation barrier, a successive approximation register analog-to-digital converter (SAR ADC) circuit located in the power constrained portion, logic circuitry located in the power constrained portion and configured to convert a current SAR ADC data sample to a transmit data sample, wherein the transmit data sample only includes active bits in bit positions that changed between the current SAR ADC data sample and a previous SAR ADC data sample, and a forward data channel. The forward data channel includes a first receiver circuit located in the non-power constrained portion, and a first transmitter circuit located in the power constrained portion and configured to transmit the transmit data sample to the first receiver circuit.

In Aspect 22, the subject matter of Aspect 21 optionally includes a clock circuit located in the non-power constrained portion and configured to produce a clock signal and back data channel. The back data channel includes a second transmitter circuit located in the non-power constrained portion, a second receiver circuit located in the power constrained portion, and logic circuitry configured to recover the clock signal from data received by the second receiver circuit.

In Aspect 23, the subject matter of one or both of Aspect 21 and 22 optionally includes a digital-to-analog converter (DAC) circuit located in the non-power constrained portion of the system, and control logic included in the non-power constrained portion of the system and configured to recover SAR ADC data samples from the transmit data and provide the recovered SAR ADC data samples to the DAC circuit.

In Aspect 24, the subject matter of one or any combination of Aspects 21-23 optionally includes multiple SAR ADC circuits located in the power constrained portion of the system, and a multiplexer circuit located in the power constrained portion of the system and configured to multiplex SAR ADC data samples from the multiple SAR ADC circuits to the forward data channel for transmitting.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A data channel comprising:
   a power constrained first channel portion to receive energy from a limited power source; the first channel portion including:
      an analog-to-digital converter (ADC) circuit to output an ADC data sample;
      a first transmitter circuit configured to serially transmit data that includes ON bits and OFF bits, wherein the first transmitter circuit uses more energy transmitting the ON bits than the OFF bits; and
      logic circuitry configured to derive transmit data from the ADC data sample, wherein the derived transmit data has a reduced number of the ON bits from the ADC data sample; and
   a non-power constrained second channel portion to receive energy from a different power source than the first channel portion, the second channel portion including a first receiver circuit to receive the derived transmit data from the first transmitter circuit of the first channel portion.

2. The data channel of claim 1,
   wherein the ADC circuit is a successive approximation register (SAR) ADC circuit; and
   wherein the data channel further includes an isolation barrier arranged to electrically isolate the first channel portion that includes the SAR ADC circuit and the first transmitter circuit from the second channel portion that includes the first receiver circuit.

3. The data channel of claim 1, including:
   a second transmitter circuit disposed in the second channel portion;
   a second receiver circuit disposed in the first channel portion, operatively coupled to the logic circuitry of the first channel portion, and configured to receive data from the second transmitter circuit disposed in the second channel portion; and clock recovery circuitry disposed in the first channel portion and configured to derive a clock signal from receive data received via the second receiver circuit, wherein the ADC circuit operates according to the derived clock signal.

4. The data channel of claim 3, wherein the logic circuitry of the first channel portion is configured to:
  receive a previous ADC data sample via the second receiver circuit;
  compare a current ADC data sample and the previous ADC data sample; and
  provide transmit data to the first transmitter circuit that only includes ON bits in bit positions where the current ADC data sample differs from the previous ADC data sample.

5. The data channel of claim 3, wherein the logic circuitry of the first channel portion is configured to:
  receive an estimated ADC data sample, via the second receiver circuit, that is an estimate of a current ADC data sample;
  compare the current ADC data sample and the received estimated ADC data sample; and
  provide transmit data to the first transmitter circuit that only includes ON bits in bit positions where the current ADC data sample differs from the estimated ADC data sample.

6. The data channel of claim 5, wherein the logic circuitry of the first channel portion is configured to:
  detect errors in the estimated ADC data sample; and
  compare the current ADC data sample and an error corrected estimated ADC data sample.

7. The data channel of claim 1, wherein the logic circuitry of the first channel portion is configured to:
  receive an estimated ADC data sample, via the second receiver circuit, that is an estimate of a current ADC data sample;
  determine errors in an estimated ADC data sample that is an estimate of a current ADC data sample; and
  provide transmit data to the first transmitter circuit that only includes ON bits in bit positions of errors in the estimated ADC data sample.

8. The data channel of claim 1, wherein the logic circuitry of the first channel portion is configured to derive the transmit data from an exclusive or (EXOR) of a current ADC data sample and one of a previous ADC data sample or an estimate of the current ADC data sample.

9. The data channel of claim 1, including:
  an adder circuit located in the second channel portion;
  wherein the logic circuitry of the first channel portion includes a subtractor circuit, and the logic circuitry is configured to derive the transmit data by subtraction of a current ADC data sample and one of a previous ADC data sample or an estimate of the current ADC data sample; and
  wherein the adder circuit adds the one of the previous ADC data sample or the estimate of the current ADC data sample to the transmit data received by the first receiver circuit of the second channel portion to recover the current ADC sample from the transmit data.

10. The data channel circuit of claim 1,
  wherein the second channel portion further includes:
    a second transmitter circuit;
    logic circuitry configured to recover a current ADC data sample from the transmit data;
    a delay circuit configured to delay the recovered current ADC data sample; and
    wherein the logic circuitry of the second channel portion is configured to generate a feedback estimate of the recovered current ADC data sample;
  wherein the first channel portion further includes a second receiver circuit configured to receive a feedback estimate of the recovered current ADC data sample from the second transmitter circuit; and
  wherein the logic circuitry of the first channel portion further includes:
    a second delay circuit configured to delay the current ADC data sample;
    estimator circuitry configured to produce an estimate of the current ADC data sample using the delayed current ADC data sample;
    error detection circuitry configured to determine errors between the estimate of the current ADC data sample and the feedback estimate of the current ADC data sample; and
    a subtractor circuit and adder circuit, and the logic circuitry of the first channel portion is configured to generate the transmit data by subtracting the estimate of the current ADC data sample from the current data sample and adding the determined errors.

11. The data channel of claim 1, including:
  a galvanic isolation barrier arranged to electrically isolate the first channel portion that includes the ADC circuit and the first transmitter circuit from the second channel portion that includes the first receiver circuit; and
  a digital-to-analog converter (DAC) circuit located in the second channel portion and operatively coupled to the first receiver circuit.

12. A method of operating a data channel to transmit data between a power constrained first channel portion and a non-power constrained second channel portion, the method comprising:
  generating an analog-to-digital converter (ADC) data sample using an ADC circuit located in the first channel portion;
  deriving transmit data from the ADC data sample by reducing a number of ON bits in the ADC data sample, wherein more energy is used by the data channel in transmitting the ON bits than transmitting OFF bits;
  transmitting the transmit data with the reduced number of ON bits from a first transmitter located in the first channel portion to a first receiver located in the second channel portion; and
  recovering the ADC data sample from the transmit data in the second channel portion.

13. The method of claim 12,
  wherein generating the ADC data sample includes generating a successive approximation register analog-to-digital converter (SAR ADC) data sample using an SAR ADC circuit located in the first channel portion; and
  wherein transmitting the transmit data includes transmitting the transmit data from the first transmitter located in the first channel portion across an electrical isolation barrier to the first receiver located in the second channel portion.

14. The method of claim 12, including:
  receiving data using a second receiver located in the first channel portion;
  deriving a clock signal using the received data; and
  determining a sample time for the ADC circuit using the derived clock signal.

15. The method of claim 12, including:
transmitting a previous ADC data sample from a second transmitter located in the second channel portion to a second receiver located in the first channel portion;
comparing a current ADC data sample and the previous ADC data sample; and
wherein deriving the transmit data includes generating transmit data that only includes the ON bits in bit positions where the current ADC data sample differs from the previous ADC data sample.

16. The method of claim 12, including:
transmitting an estimated ADC data sample from a second transmitter located in the second channel portion to a second receiver located in the first channel portion;
comparing a current ADC data sample and the estimated ADC data sample, wherein the estimated ADC circuit is an estimate of the current ADC data sample; and
generating transmit data that only includes the ON bits in bit positions where the current ADC data sample differs from the estimated ADC data sample.

17. The method of claim 16, including:
detecting errors in the estimated ADC data sample;
comparing the current ADC data sample and an error corrected estimated ADC data sample; and
generating transmit data that only includes the ON bits in bit positions where the current ADC data sample differs from the error corrected estimated ADC data sample.

18. The method of claim 12, including:
delaying an ADC data sample in the first channel portion of the data channel and producing an estimate of the current ADC data sample using the delayed ADC data sample;
delaying a recovered ADC data sample in the second channel portion of the data link and producing a feedback estimate of the current ADC data sample using the delayed recovered ADC data sample;
transmitting the feedback estimate of the current ADC data sample from a second transmitter located in the second channel portion to a second receiver located in the first channel portion;
determining errors between the estimate of the current ADC data sample and the feedback estimate of the current ADC data sample; and
generating the transmit data by subtracting the estimate of the current ADC data sample from the current ADC data sample and adding the determined errors.

19. The method of claim 12,
wherein generating the ADC data sample includes generating a first partial ADC data sample using a first stage of a multi-stage ADC circuit located in the first channel portion;
wherein deriving the transmit data includes deriving first partial transmit data by reducing the number of ON bits in the first partial ADC data prior to generating a complete ADC data sample; and
wherein transmitting the transmit data includes transmitting the first partial transmit data to the first receiver of the second channel portion prior to deriving transmit data for the complete ADC data sample.

20. The method of claim 19, wherein deriving first partial transmit data includes:
receiving a previous partial data sample of a previous complete ADC data sample using a second receiver located in the first channel portion of the data link;
comparing a current partial ADC data sample and the previous partial ADC data sample; and
generating partial transmit data that only includes the ON bits in bit positions where the current partial ADC data sample differs from the previous partial ADC data sample.

21. A data acquisition system comprising:
a power constrained portion of the system separated from a non-power constrained portion of the system by an electrical isolation barrier;
a successive approximation register analog-to-digital converter (SAR ADC) circuit located in the power constrained portion;
logic circuitry located in the power constrained portion and configured to convert a current SAR ADC data sample to a transmit data sample, wherein the transmit data sample only includes active bits in bit positions that changed between the current SAR ADC data sample and a previous SAR ADC data sample; and
a forward data channel including:
a first receiver circuit located in the non-power constrained portion; and
a first transmitter circuit located in the power constrained portion and configured to transmit the transmit data sample to the first receiver circuit.

22. The system of claim 21, including:
a clock circuit located in the non-power constrained portion and configured to produce a clock signal; and
a back data channel including:
a second transmitter circuit located in the non-power constrained portion;
a second receiver circuit located in the power constrained portion; and
wherein the logic circuitry is configured to recover the clock signal from data received by the second receiver circuit.

23. The system of claim 21, including:
a digital-to-analog converter (DAC) circuit located in the non-power constrained portion of the system; and
control logic included in the non-power constrained portion of the system and configured to recover SAR ADC data samples from the transmit data and provide the recovered SAR ADC data samples to the DAC circuit.

24. The system of claim 21, including:
multiple SAR ADC circuits located in the power constrained portion of the system; and
a multiplexer circuit located in the power constrained portion of the system and configured to multiplex SAR ADC data samples from the multiple SAR ADC circuits to the forward data channel for transmitting.

* * * * *